(12) United States Patent
Hong et al.

(10) Patent No.: US 11,687,184 B2
(45) Date of Patent: Jun. 27, 2023

(54) TOUCH DISPLAY DEVICE

(71) Applicant: Samsung Display Co., Ltd., Yongin-si (KR)

(72) Inventors: Jong-Beom Hong, Yongin-si (KR); Gun-Shik Kim, Yongin-si (KR); Jung-Joo Park, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/700,420

(22) Filed: Mar. 21, 2022

(65) Prior Publication Data

US 2022/0285451 A1 Sep. 8, 2022

Related U.S. Application Data

(63) Continuation of application No. 17/177,440, filed on Feb. 17, 2021, now Pat. No. 11,282,903, which is a
(Continued)

(30) Foreign Application Priority Data

Apr. 28, 2016 (KR) ........................ 10-2016-0052152

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0445* (2019.05); *G06F 3/0446* (2019.05);
(Continued)

(58) Field of Classification Search
CPC .... G06F 3/0412; G06F 3/0445; G06F 3/0446; G06F 3/0448; G06F 2203/04103
See application file for complete search history.

(56) References Cited

U.S. PATENT DOCUMENTS 8,304,796 B2  11/2012  Fukuda
8,531,616 B2   9/2013  Shin et al.
(Continued)

FOREIGN PATENT DOCUMENTS

CN     102213852    10/2011
CN     102375638     3/2012
(Continued)

OTHER PUBLICATIONS

Office Action dated Aug. 28, 2019, issued in Chinese Patent Application No. 201710016769.6.
(Continued)

*Primary Examiner* — Michael J Jansen, II
(74) *Attorney, Agent, or Firm* — H.C. Park & Associates, PLC (57) ABSTRACT

A touch display device including a display panel including a plurality of first pixels and a plurality of second pixels alternately disposed along a first direction, and a touch screen layer disposed on the display panel, the touch screen layer including a plurality of first touch electrodes having a zigzag shape and disposed between one of the first and second pixels along a second direction crossing the first direction, in which a first pixel of the first pixels and a second pixel of the second pixels have different sizes from each other, and a first distance from a first touch electrode of the first touch electrodes to the first pixel is different from a second distance from the first touch electrode to the second pixel.

15 Claims, 8 Drawing Sheets

Related U.S. Application Data continuation of application No. 15/275,963, filed on Sep. 26, 2016, now Pat. No. 10,957,745.

(51) Int. Cl.
*H10K 59/40* (2023.01)
*H10K 59/35* (2023.01)

(52) U.S. Cl.
CPC .. *G06F 3/0448* (2019.05); *G06F 2203/04103* (2013.01); *H10K 59/352* (2023.02); *H10K 59/353* (2023.02); *H10K 59/40* (2023.02)

(56) References Cited

U.S. PATENT DOCUMENTS

| | | | |
|---|---|---|---|
| 8,598,784 B2 | 10/2013 | Ko | |
| 8,885,178 B2 | 11/2014 | Iwamoto | |
| 8,913,025 B2 * | 12/2014 | Imamura | G06F 3/0446 |
| | | | 345/173 |
| 9,052,766 B2 | 6/2015 | Dunphy et al. | |
| 9,117,778 B2 | 8/2015 | Yanagawa et al. | |
| 9,338,878 B2 | 5/2016 | Mizumoto et al. | |
| 9,342,176 B2 | 5/2016 | Kim et al. | |
| 9,477,352 B2 | 10/2016 | Cok | |
| 9,582,124 B2 | 2/2017 | Han | |
| 9,603,239 B2 | 3/2017 | Nishioka et al. | |
| 9,639,221 B2 | 5/2017 | Chyan | |
| 9,645,695 B2 | 5/2017 | Orita et al. | |
| 9,704,926 B2 | 7/2017 | Kim | |
| 9,818,803 B2 | 11/2017 | Lee | |
| 9,846,499 B2 | 12/2017 | Chen et al. | |
| 9,857,931 B2 | 1/2018 | Hashida et al. | |
| 9,990,068 B2 | 6/2018 | Chen et al. | |
| 10,203,790 B2 * | 2/2019 | Han | H01L 51/5281 |
| 10,365,745 B2 | 7/2019 | Ishizaki et al. | |
| 10,521,058 B2 * | 12/2019 | Lee | G06F 3/0443 |
| 10,691,231 B2 * | 6/2020 | Han | G06F 3/0412 |
| 10,957,745 B2 | 3/2021 | Hong et al. | |
| 2009/0273577 A1 | 11/2009 | Chen et al. | |
| 2010/0013745 A1 * | 1/2010 | Kim | H01L 27/3244 |
| | | | 345/76 |
| 2010/0219427 A1 * | 9/2010 | Fukuda | H01L 51/5268 |
| | | | 257/89 |
| 2011/0210934 A1 * | 9/2011 | Lee | G06F 3/0446 |
| | | | 345/173 |
| 2013/0002118 A1 * | 1/2013 | Ko | G09G 3/3208 |
| | | | 313/1 |
| 2013/0016363 A1 | 1/2013 | Iwamoto | |
| 2013/0063371 A1 | 3/2013 | Lee et al. | |
| 2013/0194232 A1 * | 8/2013 | Imamura | G06F 3/0445 |
| | | | 345/174 |
| 2013/0234917 A1 * | 9/2013 | Lee | H01L 27/3218 |
| | | | 345/82 |
| 2014/0051318 A1 | 2/2014 | Cok | |
| 2014/0139761 A1 | 5/2014 | Yanagawa et al. | |
| 2014/0152915 A1 | 6/2014 | Lu et al. | |
| 2014/0225839 A1 * | 8/2014 | Dunphy | G06F 3/0412 |
| | | | 345/173 |
| 2014/0360856 A1 * | 12/2014 | Mizumoto | H05K 1/0213 |
| | | | 200/600 |
| 2015/0002464 A1 * | 1/2015 | Nishioka | H05K 1/0298 |
| | | | 349/12 |
| 2015/0029135 A1 | 1/2015 | Han | |
| 2015/0162391 A1 * | 6/2015 | Kim | H01L 27/3218 |
| | | | 257/40 |
| 2015/0346889 A1 * | 12/2015 | Chen | G06F 3/04166 |
| | | | 345/174 |
| 2015/0378484 A1 | 12/2015 | Orita et al. | |
| 2016/0018930 A1 | 1/2016 | Lee et al. | |
| 2016/0091998 A1 * | 3/2016 | Chyan | G06F 3/04883 |
| | | | 345/174 |
| 2016/0109977 A1 | 4/2016 | Hashimoto et al. | |
| 2016/0320679 A1 | 11/2016 | Lee et al. | |
| 2016/0320879 A1 | 11/2016 | Hashida et al. | |
| 2017/0060309 A1 * | 3/2017 | Chen | G02F 1/133514 |
| 2017/0075449 A1 | 3/2017 | Ko et al. | |
| 2017/0153726 A1 * | 6/2017 | Lee | G06F 3/0446 |
| 2017/0177124 A1 | 6/2017 | Konoshita | |
| 2017/0192572 A1 | 7/2017 | Han et al. | |
| 2017/0207278 A1 | 7/2017 | Lu et al. | |
| 2017/0317145 A1 * | 11/2017 | Hong | G06F 3/0446 |
| 2018/0039349 A1 * | 2/2018 | Han | G06F 3/041 |
| 2020/0233512 A1 | 7/2020 | Ko et al. | |

FOREIGN PATENT DOCUMENTS

| | | |
|---|---|---|
| CN | 103311266 | 9/2013 |
| CN | 104865728 | 8/2015 |
| KR | 2010-0010019 | 1/2010 |
| KR | 1020120054844 | 5/2012 |
| KR | 1020140039470 | 4/2014 |
| KR | 2015-0067624 | 6/2015 |

OTHER PUBLICATIONS

Office Action dated Mar. 9, 2018, in Korean Patent Application No. 10-2016-0052152.
Non-Final Office Action dated Apr. 3, 2018, in U.S. Appl. No. 15/275,963.
Non-Final Office Action dated Mar. 5, 2020, in U.S. Appl. No. 15/275,963.
Notice of Allowance dated Nov. 19, 2020, in U.S. Appl. No. 15/275,963.
Corrected Notice of Allowance dated Dec. 4, 2020, in U.S. Appl. No. 15/275,963.
Non-Final Office Action dated Jul. 8, 2021, in U.S. Appl. No. 17/177,440.
Notice of Allowance dated Nov. 9, 2021, in U.S. Appl. No. 17/177,440.

* cited by examiner

TOUCH DISPLAY DEVICE

CROSS-REFERENCE TO RELATED APPLICATION

This application is a Continuation of U.S. application Ser. No. 17/177,440, filed Feb. 17, 2021, which is a Continuation of U.S. application Ser. No. 15/275,963, filed Sep. 26, 2016, now issued as U.S. Pat. No. 10,957,745, which claims priority from and the benefit of Korean Patent Application No. 10-2016-0052152, filed on Apr. 28, 2016, each of which is hereby incorporated by reference for all purposes as if fully set forth herein.

BACKGROUND

Field

The invention relates generally a touch display device and, more particularly to a device that minimizes display defects due to variances in the overlap of the touch electrodes and pixels.

Discussion of the Background

An organic light-emitting diode (OLED) display is a self-emissive display device provided with an OLED including a hole injection electrode, an electron injection electrode, and an organic emission layer formed therebetween. In an OLED display, light is generated as excitons, which are formed by the combination of holes injected from the hole injection electrode and electrons injected form the electron injection electrode, shift from excited state to ground state.

The OLED display does not require an additional light source, and thus, may have thin and light characteristics and be driven at low voltage. Furthermore, the OLED display has a wide viewing angle, high contrast, and high response speed. Due to such high-grade characteristics, the OLED display has received attention as a next-generation display apparatus.

In general, an OLED display includes a plurality of pixels that emit different colors to display an image. A pixel may represent the smallest unit of an image displayed on a display device. A gate line for driving each pixel, a data line, a power line, and an insulating layer, such as a pixel defining layer for defining an area or the shape of each pixel, may be formed between adjacent pixels.

Recently, studies have been conducted to integrate a touch screen panel function into such display devices. A touch screen panel is an input device that enables an input of a command by touching a screen of a display device using an object, such as a finger or pen. Since such a touch screen panel obviates the need for a separate input device connected to a display device, such as a keyboard or mouse, its use in various applications have been gradually increased.

Touch screen panels are divided into a resistive overlay touch screen panel, a photosensitive touch screen panel, a capacitive touch screen panel, and the like. Among these touch screen panels, the capacitive touch screen panel converts information of a contact position into an electrical signal, by sensing a change in the capacitance formed between a conductive sensing pattern and an adjacent sensing pattern, ground electrode or the like, when an object, such as a user's hand or pen, contacts the touch screen panel.

When a touch electrode of a touch screen panel overlaps a pixel of a display panel, the luminance ratio of the pixels may be varied due to differences in the overlapping elements between the touch electrodes and the pixels, which may generate defects in the display of the touch display device.

The above information disclosed in this Background section is only for enhancement of understanding of the background of the inventive concept, and, therefore, it may contain information that does not form the prior art that is already known in this country to a person of ordinary skill in the art.

SUMMARY

The invention provides a touch display device capable of decreasing display defects due to variances in the overlap of the touch electrodes and pixels. The principles of invention may be achieved by forming pixels in a touch screen to have different sizes and/or forming touch electrodes to have a zigzag shape.

Additional aspects will be set forth in the detailed description which follows, and, in part, will be apparent from the disclosure, or may be learned by practice of the inventive concept.

According to an exemplary embodiment, a touch display device includes a display panel including a plurality of first pixels and a plurality of second pixels alternately disposed along a first direction, and a touch screen layer disposed on the display panel, the touch screen layer including first touch electrodes have a zigzag shape and disposed between one of the first and second pixels along a second direction crossing the first direction, in which a first pixel of the first pixels and a second pixel of the second pixels have different sizes from each other, and a first distance from a first touch electrode of the first touch electrodes to the first pixel is different from a second distance from the first touch electrode to the second pixel.

The first pixel may have a smaller size than the second pixel, and the first distance may be shorter than the second distance.

The display panel may further include third pixels alternately arranged with the first pixels along the second direction, the touch screen layer may further include second touch electrodes having a zigzag shape, the first pixel may have a different size from a third pixel of the third pixels, and a third distance from a second touch electrode of the second touch electrodes to the first pixel may be different from a fourth distance from the second touch electrode to the third pixel.

The first pixel may have a smaller size than the third pixel, and the third distance may be shorter than the fourth distance.

A center of the first pixel may overlap a center of a virtual quadrangle, a center of the second pixel may be disposed on a first vertex of the virtual quadrangle, and a center of the third pixel may be disposed on a second vertex of the virtual quadrangle adjacent to the first vertex.

A longitudinal extent of the first touch electrode may be formed along the second direction, and a longitudinal extent of the second touch electrode may be formed along the first direction.

A longitudinal extent of the first touch electrode may be disposed along the second direction, and the first touch electrodes and the second touch electrodes may each include a connection portion disposed along a direction different from the first direction and the second direction.

The second pixels and the third pixels may be alternately disposed along a virtual line, and the first pixel may be surrounded by the second and third pixels.

The first, second, and third pixels may be each configured to emit light of different colors.

The first, second, and third pixels may be configured to emit green light, blue light, and red light, respectively.

According to an exemplary embodiment, a touch display device includes a display panel including a plurality of first pixels and a plurality of second pixels alternately disposed along a first direction, and a touch screen layer disposed on the display panel, the touch screen layer including a plurality of first touch electrodes and a plurality of second touch electrodes disposed between the first and second pixels, respectively, in which the first touch electrodes are disposed along the first direction, and each of the first touch electrodes has a zigzag shape and includes a connecting portion extending in a second direction different from the first direction.

The second touch electrodes may intersect the first touch electrodes, and each of the second touch electrodes may have a zigzag shape and includes a connecting portion extending in the second direction.

A first pixel of the first pixels may have a different size from a second pixel of the second pixels.

Each of the first and second touch electrodes may further include a second connecting portion extending in a third direction crossing the second direction.

The first connection portion of the first touch electrode may partially overlap the first connection portion of the second touch electrode.

According to an exemplary embodiment, a touch display device includes a display panel including a first pixel and a second pixel disposed adjacent to each other, and a touch screen layer disposed on the display panel and including intersecting touch electrodes, the intersecting touch electrodes forming a first touch area and a second touch area having different sizes from each other, in which the first touch area and the second touch area overlap the first pixel and the second pixel, respectively; and a first overlapping area between the first touch area and the first pixel is smaller than a second overlapping area between the second touch area and the second pixel.

The first pixel may be smaller than the second pixel.

The first touch area may be smaller than the second touch area.

The touch electrodes may have a zigzag shape.

The first and second pixels are each configured to emit light of different colors.

According to a pixel arrangement of exemplary embodiments, gaps between pixels emitting colors of the same color may be wide, such that the reliability of deposition may be improved. The gaps between pixel emitting different colors of light may be narrow, such that the aperture ratio may be improved.

In addition, touch electrodes may be disposed at a different distance with respect to each pixel. Thus, an overlapping extent ratio between each pixel and the touch electrodes may be adjusted, and thus, luminance decreasing ratio according to viewing angle may be adjusted. Thus, defects of display touch display device may be prevented.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 4 is a cross-sectional view taken along line I-I' of FIG. 1.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
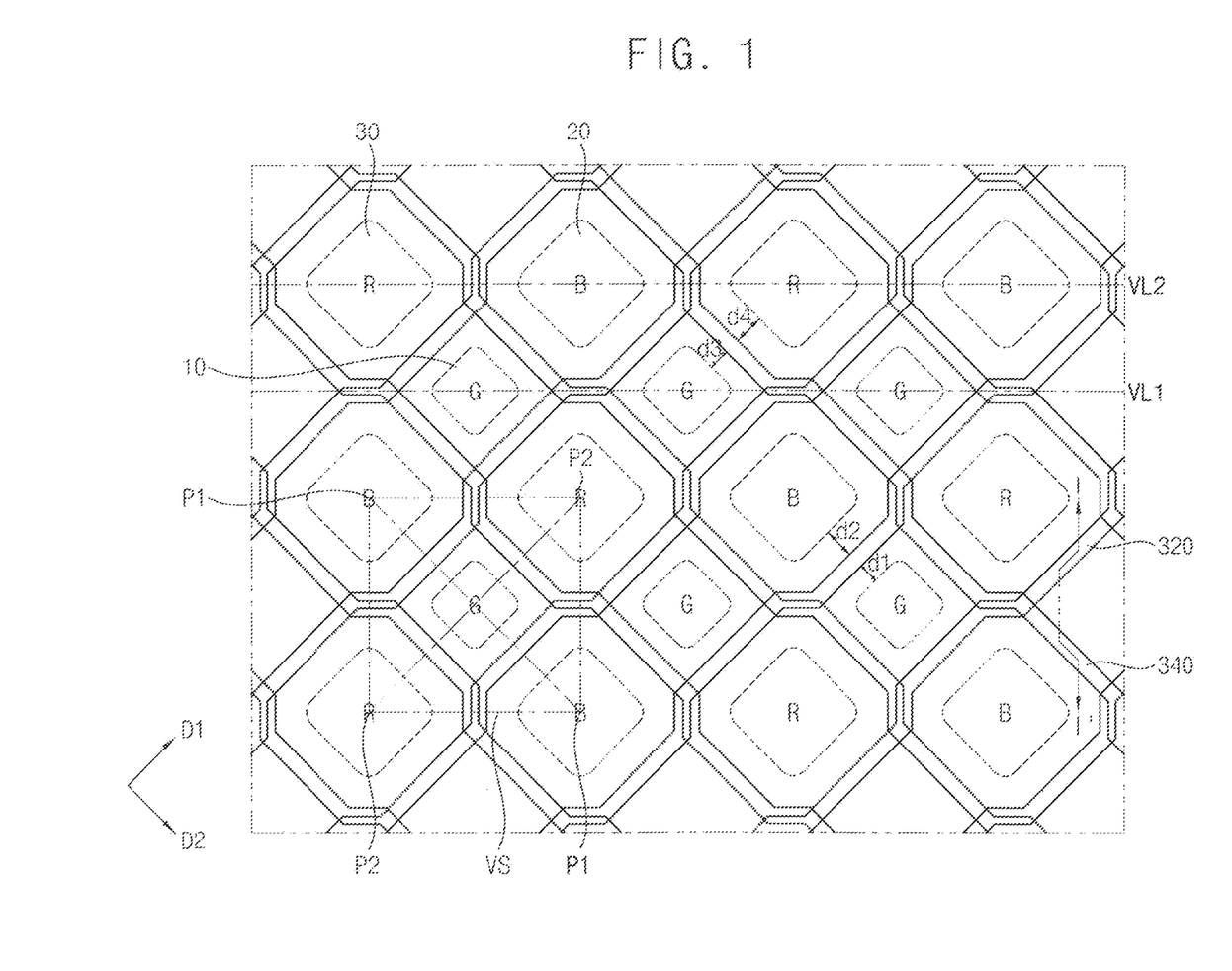
FIG. 1 is a plan view schematically illustrating an exemplary embodiment of a touch display device constructed according to the principles of the invention.
Figure 2:
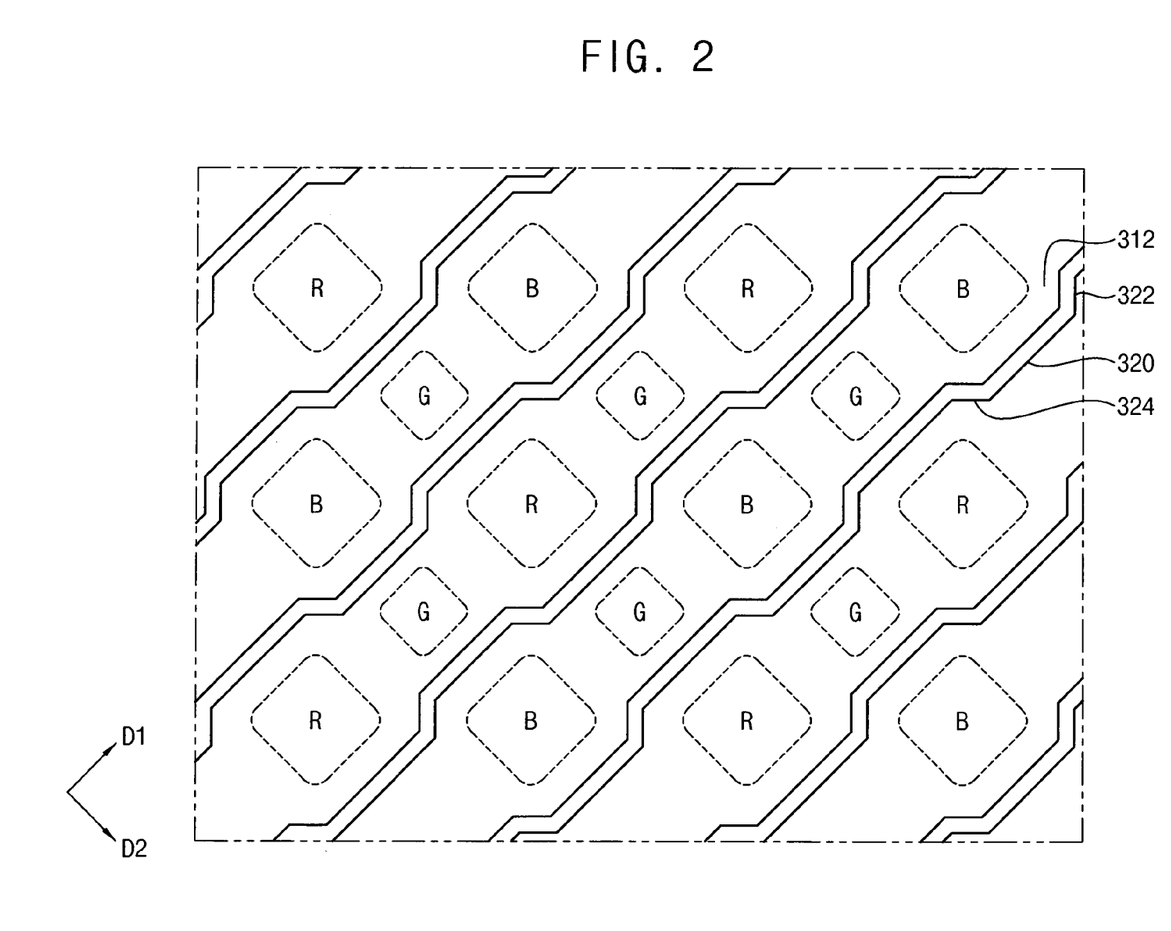
FIG. 2 is a plan view schematically illustrating a first touch electrode of FIG. 1.
Figure 3:
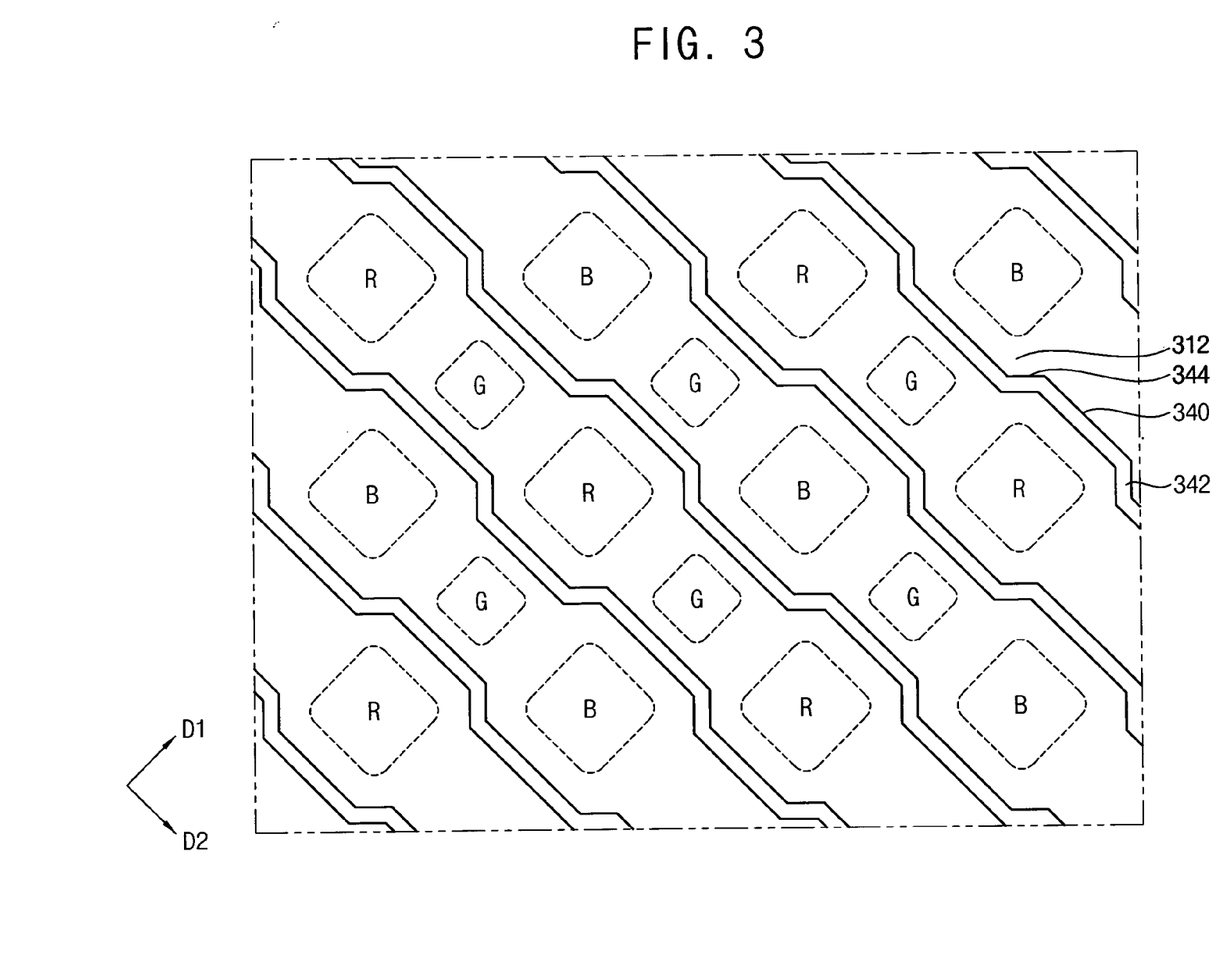
FIG. 3 is a plan view schematically illustrating a second touch electrode of FIG.

FIG. 1 is a plan view schematically illustrating an exemplary embodiment of a touch display device constructed according to the principles of the invention. FIG. 2 is a plan view schematically illustrating a first touch electrode of FIG. 1. FIG. 3 is a plan view schematically illustrating a second touch electrode of FIG. 1.

Referring to FIGS. 1 to 3, a touch display device according to an exemplary embodiment includes a plurality of pixel areas, and a first touch electrode 320 and a second touch electrode 340 disposed on a pixel defining layer 312 between the pixel areas. In FIGS. 1 to 3, a touch screen layer, which will be described below, may be disposed on the pixel area, and thus, the pixel areas are shown in dashed line.

The pixel areas include first pixels 10, second pixels 20, and third pixels 30. The first pixel 10 may have a smaller area than each of the adjacent second and third pixels 20 and 30. The first pixel 10 may have a polygonal shape, more specifically, a quadrilateral shape. In exemplary embodiments, the polygonal shape or the quadrilateral shape may include a rounded polygon or quadrangle. More particularly, the first pixel 10 may have a rounded quadrangle shape.

The first pixels 10 may have substantially the same quadrilateral shape. The first pixels 10 may be spaced apart from one another and formed along a first virtual line VL1. The first pixel 10 may emit green light, and may include an organic emission layer for emitting the green light.

The second pixel 20 may be formed on a first vertex P1 of a virtual quadrangle VS, in which the center thereof may be the center of the first pixel 10. The third pixel 30 may be formed on a second vertex P2 of the virtual quadrangle VS. The virtual quadrangle VS may be a square.

The second pixel 20 may be spaced apart from the first pixel 10, and the center of the second pixel 20 may be positioned on or overlap the first vertex P1. The second pixel 20 may have a larger area than that of the adjacent first pixel 10. The second pixel 20 may have a polygonal shape, more specifically, a quadrilateral shape. The second pixels 20 may have substantially the same quadrilateral shape. The second pixels 20 may be spaced apart from one another having the first pixel 10 therebetween. The second pixel 20 may emit blue light, and may include an organic emission layer for emitting the blue light.

The third pixel 30 may be spaced apart from the first pixel 10 and the second pixel 20, and the center of the third pixel 30 may be positioned on or overlap the second vertex P2 adjacent to the first vertex P1. The third pixel 30 may have a larger area than that of the adjacent first pixel 10 and substantially the same area as that of the second pixel 20.

The third pixel 30 may have a polygonal shape, more specifically, a quadrilateral shape. The third pixels 30 may have substantially the same quadrilateral shape. The third pixels 30 may be spaced apart from one another having the first pixel 10 therebetween. The third pixel 30 may emit red light, and may include an organic emission layer for emitting the red light.

The third pixels 30 and the second pixels 20 may be alternately formed along a second virtual line VL2. In this manner, the second pixels 20 and the third pixels 30 may substantially surround the first pixel 10. More particularly, the first pixels 10 and the third pixels 30 are alternately disposed along a first direction D1, and the first pixels 10 and the second pixels 20 are alternately disposed along a second direction D2.

Furthermore, since the second pixels 20 and the third pixels 30 substantially surround the first pixel 10, an aperture ratio of each of the first to third pixels 10 to 30 may be improved. In this manner, the manufacturing cost and the manufacturing time of the touch display device may be reduced, and the quality of an image displayed on the touch display device may be improved.

According to an exemplary embodiment of a pixel arrangement, gaps between pixels of the same color are wide, such that the reliability of deposition during manufacture may be improved. In addition, gaps between pixels emitting different colors, which constitute sub-pixels, are narrow, such that the aperture ratio may be improved.

A touch screen layer is disposed on the display panel. The touch screen layer may be a touch screen panel, and may include a first touch electrode 320 and a second touch electrode 340.

The first touch electrode 320 extends in the first direction D1. More particularly, a longitudinal extent of the first touch electrode 320 is formed along the first direction D1. The first touch electrode 320 may have a zigzag shape. The first touch electrode 320 may be disposed in an area between the pixel areas. The first touch electrode 320 may be spaced apart from the first pixel 10 by a first distance d1. In addition, the first touch electrode 320 may be spaced apart from the third pixel 30 by a second distance d2. More particularly, a distance between the first touch electrode 320 and the first pixel 10 (e.g., the first distance d1) may be different from a distance between the first touch electrode 320 and the third pixel 30 (e.g., the second distance d2). In addition, a distance between the first touch electrode 320 and the first pixel 10 (e.g., the first distance d1) may be different from a distance between the first touch electrode 320 and the second pixel 20. In addition, the first touch electrode 320 may include connection portions extending in a direction at an acute angle relative to the first direction D1. More particularly, a first connection portion 322 and a second connection portion 324 may be connected to a portion of the first touch electrode 320 extending along the first direction D1. Extending directions of the first connection portion 322 and the second connection portion 324 may intersect each other.

Each pixel of the display panel according to an exemplary embodiment has a different aperture ratio. However, when touch electrodes are arranged to have an equal interval, and when viewing angle is increased, an overlapping extent ratio between each pixel and the touch electrodes may be varied. Accordingly, a change of luminance ratio for each pixel may be varied according to the viewing angle, which may generate defects in a display of the touch display device.

According to exemplary embodiments, however, the first touch electrode 320 is disposed at a different distance with respect to each pixel. Thus, an overlapping extent ratio between each pixel and the touch electrodes may be adjusted, and thus, luminance decreasing ratio according to viewing angle may be adjusted. In this manner, defects in a display of the touch display device may be prevented or reduced.

The second touch electrode 340 extends in the second direction D2 crossing the first direction D1. More particularly, a longitudinal extent of the second touch electrode 340 is formed along the second direction D2. The second touch electrode 340 may have a zigzag shape. The second touch electrode 340 may be disposed in an area between the pixel areas. The second touch electrode 340 may be spaced apart from the first pixel 10 by a third distance d3. In addition, the second touch electrode 340 may be spaced apart from the third pixel 30 by a fourth distance d4. More particularly, a distance between the second touch electrode 340 and the first pixel 10 (e.g., the third distance d3) may be different from a distance between the second touch electrode 340 and the third pixel 30 (e.g., the fourth distance d4). In addition, a distance between the second touch electrode 340 and the first pixel 10 (e.g., the third distance d3) may be different from a distance between the second touch electrode 340 and the second pixel 20. In addition, the second touch electrode 340 may include connection portions extending in a direction at an acute angle relative to the second direction D2. More particularly, a first connection portion 342 and a second connection portion 344 may be connected to a portion of the second touch electrode 340 extending along the second direction D2. Extending directions of the first connection portion 342 and the second connection portion 344 of the second touch electrode 340 may intersect each other. An extending direction of the connection portions of the second touch electrode 340 may be the same with that of the connection portions of the first touch electrode 320. In this manner, the first connection portions 322 and 342 of the first touch electrode 320 and the second touch electrode 340 may partially overlap each other, and the second connection portions 324 and 344 of the first touch electrode 320 and the second touch electrode 340 may partially overlap each other.

Each pixel of the display panel according to an exemplary embodiment has a different aperture ratio. However, when touch electrodes are arranged to have an equal interval, and when viewing angle is increased, an overlapping extent ratio between each pixel and the touch electrodes may be varied. Accordingly, a change of luminance ratio for each pixel may be varied according to the viewing angle, which may generate defects in a display of the touch display device.

According to exemplary embodiments, however, the second touch electrode 340 is disposed at a different distance with respect to each pixel. Thus, an overlapping extent ratio between each pixel and the touch electrodes may be adjusted, and thus, luminance decreasing ratio according to viewing angle may be adjusted. In this manner, defects in a display of the touch display device may be prevented.

According to exemplary embodiments, the first touch electrodes 320 and the second touch electrodes 340 intersecting the first touch electrodes 340 may form a first touch area and a second touch area. As shown in FIG. 1, the first touch area may overlap the first pixel 10 and the second touch area may overlap the second pixel 20 and/or the third pixel 30. Since the first touch electrodes 320 and the second touch electrodes 340 each have a zigzag shape, the first touch area may be smaller than the second touch area. In this manner, an overlapping area between the first touch area and the first pixel 10 may be smaller than an overlapping area between the second touch area and the second and/or third pixels 20 and 30.

Although FIGS. 1 to 3 illustrate that each of the first touch electrodes 320 and the second touch electrodes 340 continuously extends along the first direction D1 and the second direction D2, respectively, it is contemplated that, however, each of the first touch electrodes 320 and the second touch electrodes 340 may be separated from each other by the pixel area or by corresponding pixels.

FIG. 4 is a cross-sectional view taken along line I-I' of FIG. 1.

Referring to FIG. 4, a touch screen layer 300 according to an exemplary embodiment includes a base substrate 310, a first insulation layer 330, a second insulation layer 350, a first touch electrode 320 and a second touch electrode 340.

The base substrate 310 may be a transparent substrate. The base substrate 310 may include a flexible material, such as flexible polyethylene terephthalate (PET), polycarbonate (PC), polyethylene (PE), polyvinyl chloride (PVC), polypropylene (PP), polystyrene (PS), or polymethyl methacrylate methyl ester (PMMA).

The base substrate 310 may be an upper substrate of the display panel DP of a display device. Alternatively, the base substrate 310 may be a separate substrate attached to the display panel DP.

The first touch electrode 320 is disposed on the base substrate 310. The first touch electrode 320 may include a low-resistance metallic material, such as copper (Cu), aluminum (Al), molybdenum (Mo), titanium (Ti), silver (Ag), gold (Au), nickel (Ni), chromium (Cr), iron (Fe), indium (In), and uranium (Ga).

The first insulation layer 330 is formed on the first touch electrode 320. The first insulation layer 330 may include an inorganic material such as silicon oxide ($SiO_x$) and/or silicon nitride ($SiN_x$). For example, the first insulation layer 330 includes silicon oxide ($SiO_x$), and may have a thickness of about 500 Å. In addition, the first insulation layer 330 may include a plurality of layers including different materials from each other.

The second touch electrode 340 is disposed on the first insulation layer 330. The second touch electrode 340 may include a low-resistance metallic material, such as copper (Cu), aluminum (Al), molybdenum (Mo), titanium (Ti), silver (Ag), gold (Au), nickel (Ni), chromium (Cr), iron (Fe), indium (In), and gallium (Ga).

The second insulation layer 350 is formed on the second touch electrode 340. The second insulation layer 350 may include an inorganic material such as silicon oxide ($SiO_x$) and/or silicon nitride ($SiN_x$). For example, the second insulation layer 350 includes silicon oxide ($SiO_x$), and may have a thickness of about 500 Å. In addition, the second insulation layer 350 may include a plurality of layers including different materials from each other.

Figure 5:
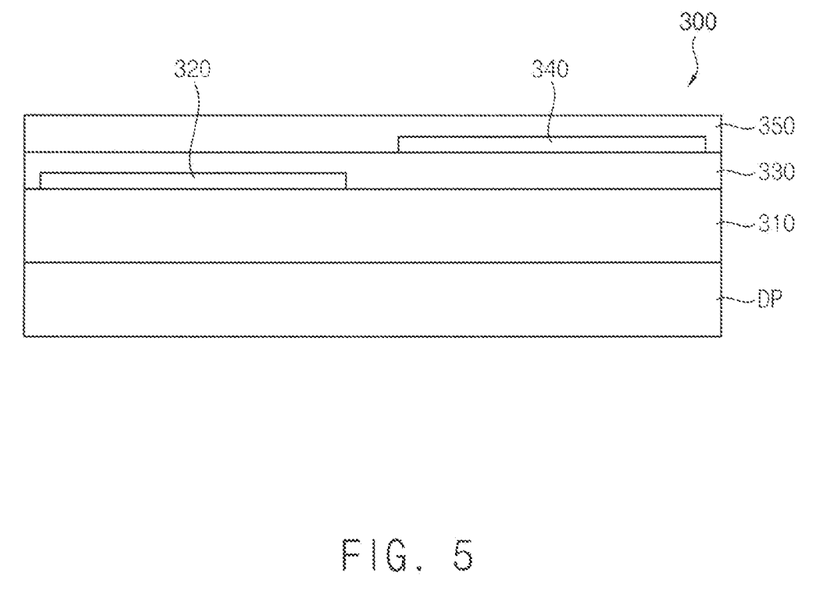
FIG. 5 and FIG. 6 are cross-sectional views schematically illustrating a method of manufacturing the touch display device of FIG. 4.
Figure 6:
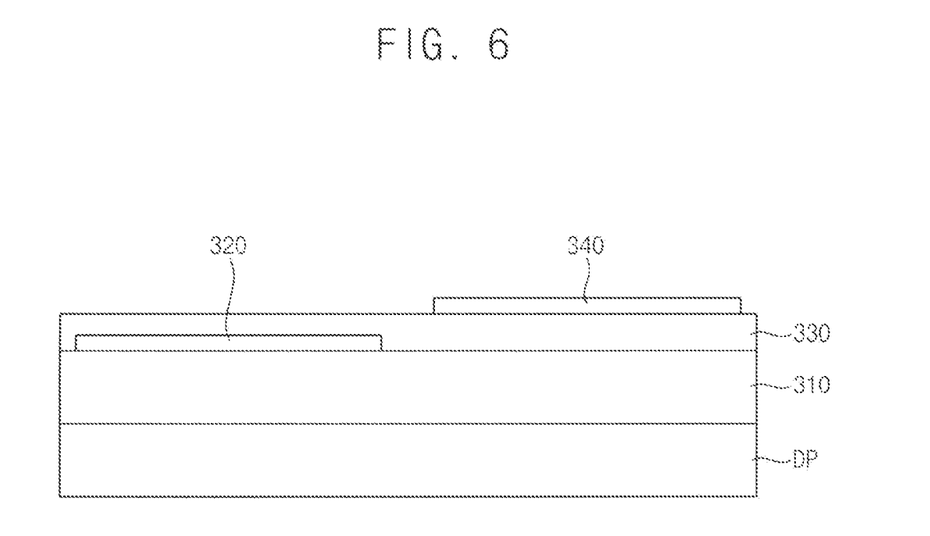
Figure 7:
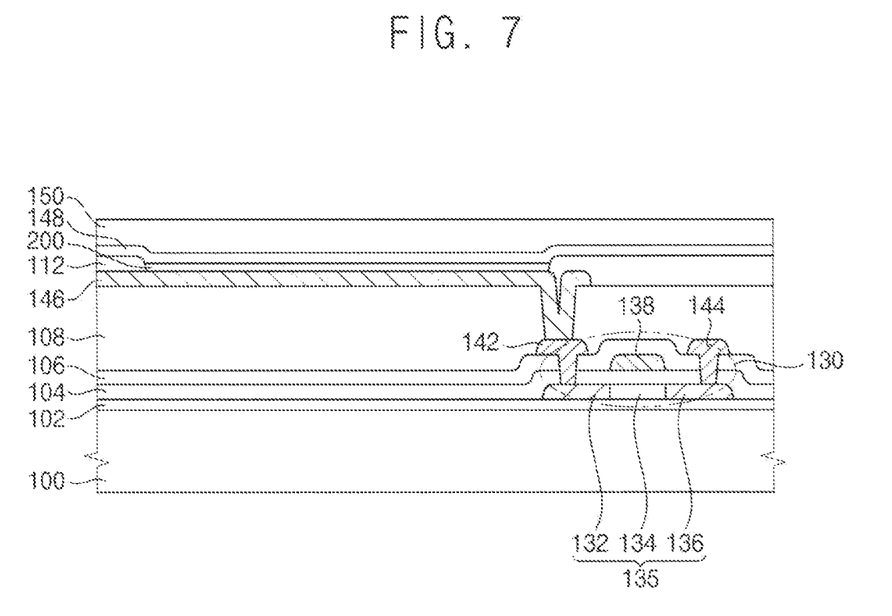
FIG. 7 is a plan view schematically illustrating an exemplary embodiment of a display panel constructed according to the principles of the invention.

FIGS. 5 to 7 are cross-sectional views schematically illustrating a method of manufacturing the touch display device of FIG. 4.

Referring to FIG. 5, the first touch electrode 320 and the first insulation layer 330 are formed on the base substrate 310.

The base substrate 310 may be an upper substrate of the display panel DP of a display device. Alternatively, the base substrate 310 may be a separate substrate attached to the display panel DP. The first touch electrode 320 is disposed on the base substrate 310. The first touch electrode 320 may include a low-resistance metallic material, such as copper (Cu), aluminum (Al), molybdenum (Mo), titanium (Ti), silver (Ag), gold (Au), nickel (Ni), chromium (Cr), iron (Fe), indium (In), and gallium (Ga).

The first insulation layer 330 is formed on the first touch electrode 320. The first insulation layer 330 may include an inorganic material such as silicon oxide ($SiO_x$) and/or silicon nitride ($SiN_x$). For example, the first insulation layer 330 includes silicon oxide ($SiO_x$), and may have a thickness of about 500 Å. In addition, the first insulation layer 330 may include a plurality of layers including different materials from each other.

Referring to FIG. 6, the second touch electrode 340 is formed on the base substrate 310, on which the first insulation layer 330 is formed.

The second touch electrode 340 is disposed on the first insulation layer 330. The second touch electrode 340 may include a low-resistance metallic material, such as copper (Cu), aluminum (Al), molybdenum (Mo), titanium (Ti), silver (Ag), gold (Au), nickel (Ni), chromium (Cr), iron (Fe), indium (In), and gallium (Ga).

Referring back to FIG. 4, the second insulation layer 350 is formed on the base substrate 310, on which the second touch electrode 340 is formed.

The second insulation layer 350 is formed on the second touch electrode 340. The second insulation layer 350 may include an inorganic material such as silicon oxide ($SiO_x$) and/or silicon nitride ($SiN_x$). For example, the second insulation layer 350 includes silicon oxide ($SiO_x$), and may have a thickness of about 500 Å. In addition, the second insulation layer 350 may include a plurality of layers including different materials from each other.

The touch screen layer 300 is attached on the display panel DP. However, when the base substrate 310 is an upper substrate of the display panel DP of a display device, the touch screen layer 300 may be directly formed on the display panel DP.

Referring to FIG. 7, a touch display device according to an exemplary embodiment includes a display panel DP configured to display an image and a touch screen layer 300 disposed on the display panel DP. In the present exemplary embodiment, the touch display device is an organic light emitting diode touch display device.

The display panel DP includes a lower substrate 100, a buffer layer 102, a gate insulating layer 104, an insulating interlayer 106, a planarizing layer 108, a pixel defining layer 112, a thin film transistor (TFT) 130, a first electrode 146, a second electrode 148, an organic light emitting element 200, and an encapsulation substrate 150.

The lower substrate 100 may include a transparent insulating substrate. For example, the lower substrate 100 may include a glass substrate, a quartz substrate, a transparent resin substrate including a transparent resin, etc. Examples of a transparent resin that may be used for the lower substrate 100 may include a polyimide resin, an acrylic resin, a polyacrylate resin, a polycarbonate resin, a polyether resin, a polyethylene terephthalate resin, a sulfonic acid based resin, and etc.

The buffer layer 102 is disposed on the lower substrate 100, and includes an insulating material. Examples of the insulating material that may be used for the buffer layer 102 may include an inorganic insulating materials such as silicon oxide ($SiO_x$), silicon nitride ($SiN_x$), silicon oxynitride ($SiO_xN_y$), silicon carbon-oxide ($SiO_xC_y$), silicon carton-nitride ($SiC_xN_y$), etc. The inorganic insulating material may be used alone, a combination thereof, a mixture thereof, or a stacked structure thereof. When the buffer layer 102 includes the stacked structure, the buffer layer 102 may have a multi-layered structure including a silicon oxide layer, a silicon nitride layer, a silicon oxynitride layer, a silicon carton-oxide layer, and/or a silicon carbon-nitride layer.

The buffer layer 102 prevents diffusion of metal atoms or impurities from the lower substrate 100 to control heat transfer speed during subsequent crystallization process for an active pattern 135. Thus, electric characteristics of the active pattern 135 may be improved. Also, the buffer layer 102 planarizes a surface of the lower substrate 100.

The active pattern 135 is disposed on the buffer layer 102. For example, the active pattern 135 may include polysilicon. The active pattern 135 includes a drain contact portion 132, a source contact portion 136, and a channel portion 134. The drain contact portion 132 contacts with a drain electrode 142 of a thin film transistor 130. The source contact portion 136 contacts with a source electrode 144 of the thin film transistor 130. The channel portion 134 is interposed between the drain contact portion 132 and the source contact portion 136.

The gate insulating layer 104 is disposed on the buffer layer 102 on which the active pattern 135 is formed, to electrically insulate the active pattern 135 from the gate electrode 138 and a gate line (not shown). The gate insulating layer 104 may include silicon nitride, metal oxide, etc. Examples of an insulating material that may be used for the gate insulating layer 104 may include hafnium oxide ($HfO_x$), aluminum oxide ($AlO_x$), zirconium oxide ($ZrO_x$), titanium oxide ($TiO_x$), Tantalum oxide ($TaO_x$), etc. These may be used alone, a combination thereof, a mixture thereof or a stacked structure thereof. The gate insulating layer 104 may include a plurality of contact holes through which the source contact portion 136 and the drain contact portion 132 are exposed.

The gate electrode 138 is disposed on the gate insulating layer 104. The gate electrode 138 is disposed on the channel portion 134 of the active pattern 135. When a voltage difference is formed between the gate electrode 138 and the source electrode 144, the thin film transistor 130 is turned on, such that a current flows through the channel portion 134 toward the drain electrode 142.

The gate electrode 138 may include a conductive material, such as metal, alloy, metal nitride, conductive metal oxide, transparent conductive material, etc. Examples of the conductive material that may be used for the gate electrode 138 may include aluminum, aluminum alloy, aluminum nitride ($AlN_x$), silver (Ag), silver alloy, tungsten (W), tungsten nitride ($WN_x$), copper, copper alloy, nickel (Ni), chromium (Cr), chromium nitride ($CrN_x$), molybdenum (Mo), molybdenum alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), indium tin oxide (ITO), tin oxide ($SnO_x$), indium oxide ($InO_x$), gallium oxide ($GaO_x$), indium zinc oxide (IZO), etc. These can be used alone or in a combination thereof. Also, the gate electrode 138 may have a mono-layered structure or a multi-layered structure including a metal layer, an alloy layer, a metal nitride layer, a conductive metal oxide layer, and/or a transparent conductive material layer.

The insulating interlayer 106 is formed on the gate insulating layer 104 on which the gate electrode 138 and the gate line (not shown) are formed. The insulating interlayer 106 insulates the gate electrode 138 and the gate line (not shown) from the source electrode 144 and the drain electrode 142.

The insulating interlayer 106 may include silicon compound. Examples of an insulating material that may be used for the insulating interlayer 106 may include silicon oxide, silicon nitride, silicon oxynitride, silicon carbon-nitride, silicon carbon-oxide, etc. These may be used alone of in a combination thereof. The insulating interlayer 106 has a plurality of contact holes through which the source contact portion 136 and the drain contact portion 132 of the active pattern 135 are exposed.

The source electrode 144 and the drain electrode 142 are formed on the insulating interlayer 106. The source electrode 144 and the drain electrode 142 contact with the source contact portion 136 and the drain contact portion 132 of the active pattern 135, respectively.

The source and drain electrodes 144 and 142 may include a conductive material, such as metal, alloy, metal nitride, conductive metal oxide, transparent conductive material, etc. Examples of the conductive material that may be used for the source and drain electrodes 144 and 142 may include aluminum, aluminum alloy, aluminum nitride ($AlN_x$), silver (Ag), silver alloy, tungsten (W), tungsten nitride ($WN_x$), copper, copper alloy, nickel (Ni), chromium (Cr), chromium nitride ($CrN_x$), molybdenum (Mo), molybdenum alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), indium tin oxide (ITO), tin oxide ($SnO_x$), indium oxide ($InO_x$), gallium oxide ($GaO_x$), indium zinc oxide (IZO), etc. These can be used alone or in a combination thereof. Also, the source and drain electrodes 144 and 142 may have a mono-layered structure or a multi-layered structure including a metal layer, an alloy layer, a metal nitride layer, a conductive metal oxide layer, and/or a transparent conductive material layer.

The planarizing layer 108 is formed on the insulating interlayer 106 on which the source and drain electrodes 144 and 142 and the date line (not shown) are disposed, to electrically insulate the source electrode 144 from the first electrode 146.

The planarizing layer 108 may include organic insulating material or inorganic insulating material. Examples of the insulating material that may be used for the planarizing layer 108 may include a photoresist, an acrylic resin, a polyimide resin, a polyamide resin, a siloxine resin, a photoresist acryl carboxyl resin, a novolak resin, an alkaline soluble resin, silicon compound, silicon nitride, silicon oxynitride, silicon carbon-oxide, silicon carbon-nitride, etc. These may be used alone or in a combination thereof.

The planarizing layer 108 has a contact hole through which the drain electrode 142 is exposed.

The first electrode 146 is disposed on the planarizing layer 108 corresponding to the pixel region, and is electrically connected to the drain electrode 142 through the contact hole of the planarizing layer 108.

When the display panel DP has a front illumination type, the first electrode 146 may include a reflective metal, a reflective alloy, etc. For example, the first electrode 146 may include silver, platinum, gold, chromium, tungsten, molybdenum, titanium, palladium, iridium, an alloy thereof, etc. These may be alone or in a combination thereof. Alternatively, the first electrode 146 may include a transparent conductive material, such as indium tin oxide, tin oxide, indium zinc oxide, zinc oxide, indium gallium oxide, gallium oxide, etc. These may be used alone or in a combination thereof.

The pixel defining layer 112 is disposed on the planarizing layer 108 on which the first electrode 146 is formed, to expose a portion of the first electrode 146. The pixel defining layer 112 may include organic material or inorganic material. Examples of the material that may be used for the pixel defining layer 112 may include photoresist, a poly acrylic resin, a polyimide resin, an acrylic resin, a silicon compound, etc. A display region and a non-display region are defined on the OLED by the pixel defining layer 112, through which a portion of the first electrode 146 is disposed. For example, the exposed portion of the first electrode 146, which is exposed by the pixel defining layer 112, corresponds to the display region. A remaining portion of the pixel defining layer 112 defines a non-display region.

The organic light emitting element 200 is disposed on the exposed portion of the first electrode 146 by the pixel defining layer 112. The second electrode 148 covers the organic light emitting element 200 and the pixel defining layer 112.

When the display panel DP has the front illumination type, the second electrode 148 may include a transparent conductive material. Examples of the transparent conductive material that may be used for the second electrode 148 may include indium tin oxide, tin oxide, indium zinc oxide, zinc oxide, indium gallium oxide, gallium oxide, etc. These may be used alone or in a combination thereof.

Figure 8:
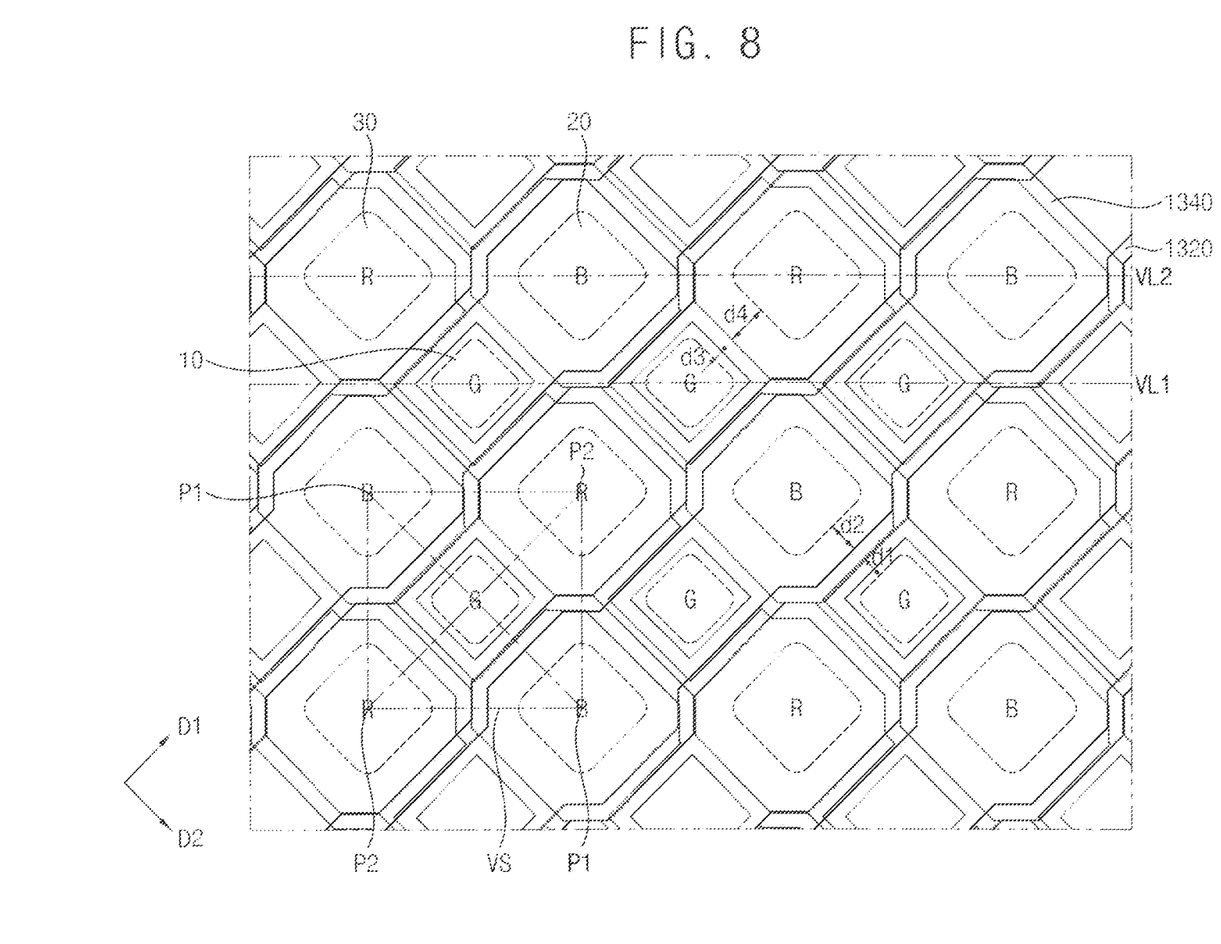
FIG. 8 is a plan view schematically illustrating an exemplary embodiment of a display panel constructed according to the principles of the invention.
Figure 9:
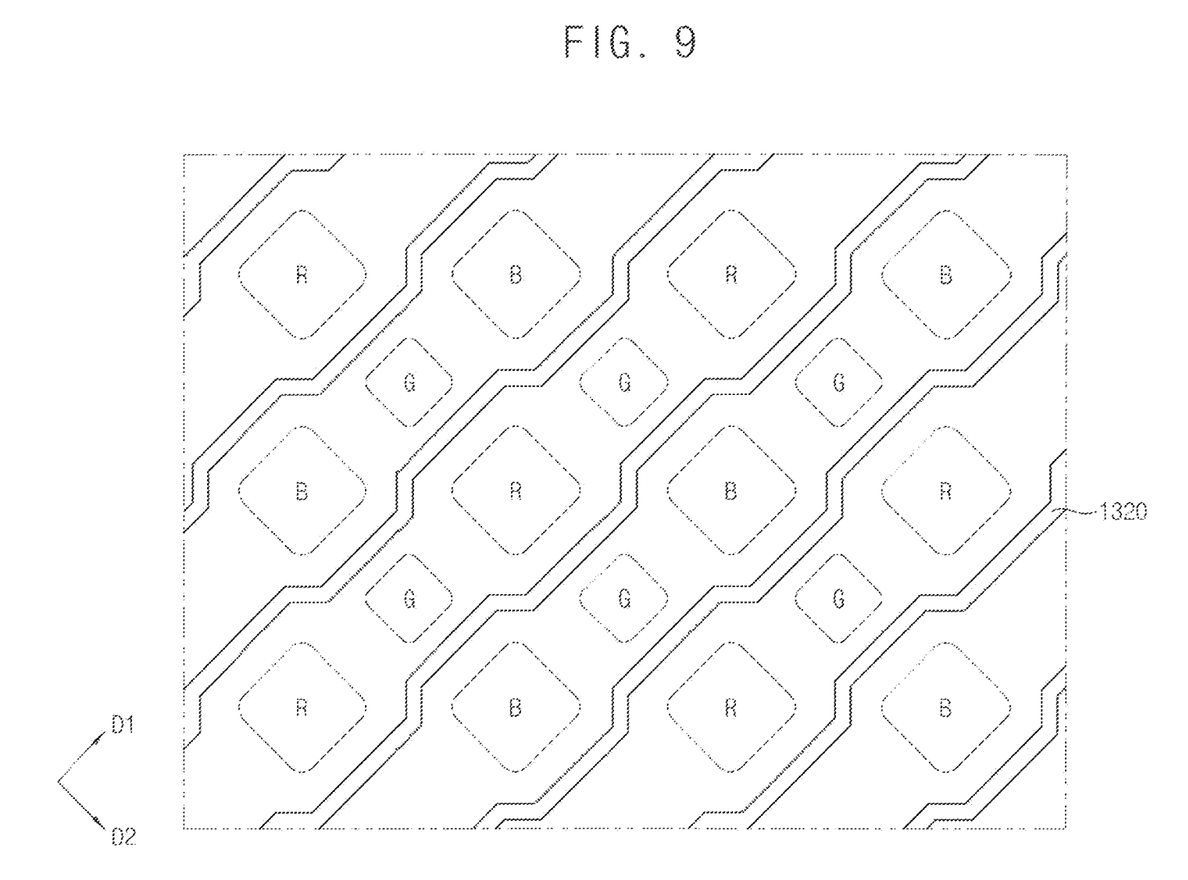
FIG. 9 is a plan view illustrating a first touch electrode of FIG. 8.
Figure 10:
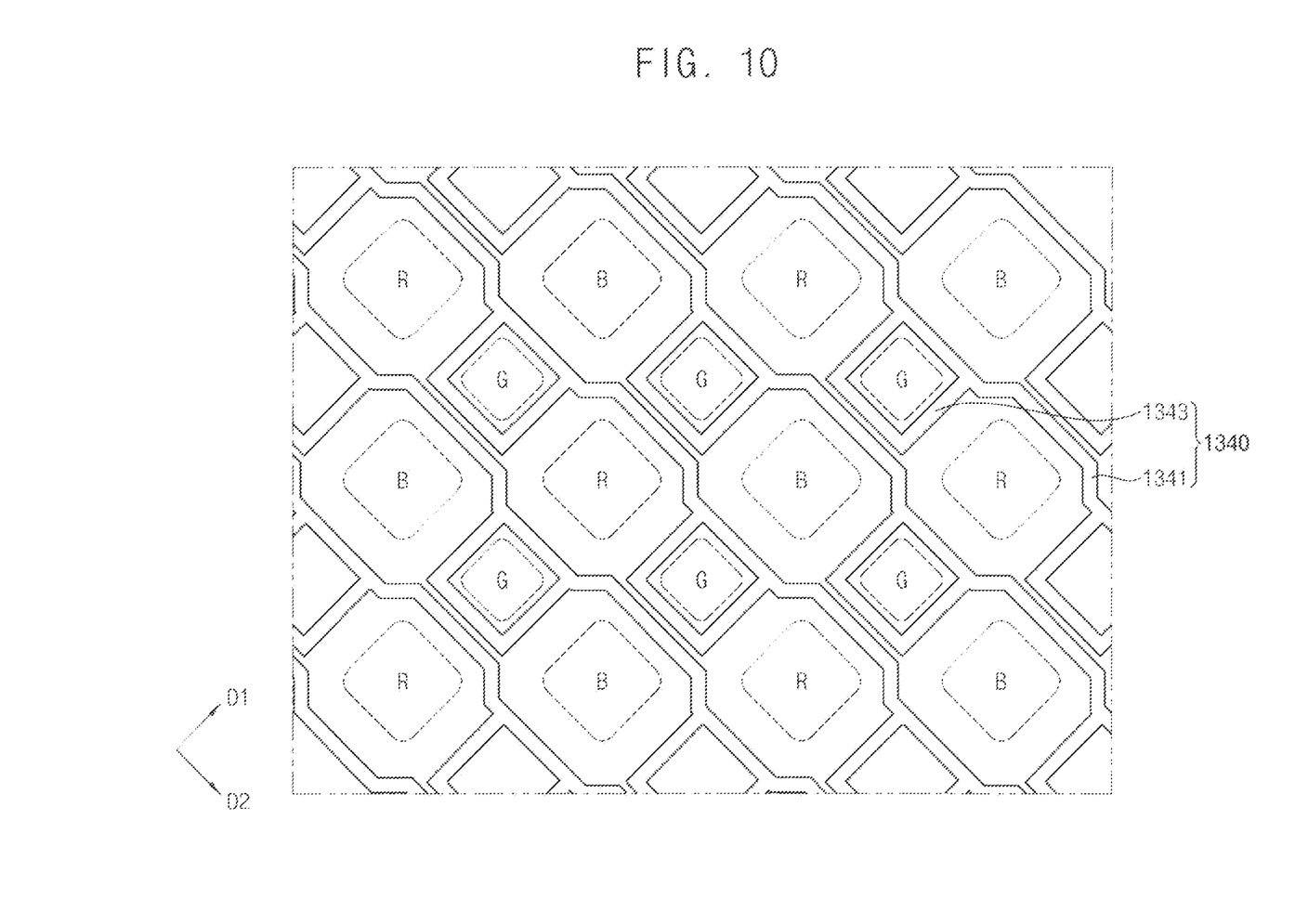
FIG. 10 is a plan view illustrating a second touch electrode of FIG. 8.

FIG. 8 is a plan view schematically illustrating an exemplary embodiment of a touch display device constructed according to the principles of the invention. FIG. 9 is a plan view schematically illustrating a first touch electrode of FIG. 8. FIG. 10 is a plan view schematically illustrating a second touch electrode of FIG. 8.

Referring to FIGS. 8 to 10, a touch display device according to an exemplary embodiment includes a plurality of pixel areas, and a first touch electrode 1320 and a second touch electrode 1340 disposed between the pixel areas.

The pixel areas include first pixels 10, second pixels 20, and third pixels 30.

The first pixel 10 may have a smaller area than each of the adjacent second and third pixels 20 and 30. The first pixel 10 may have a polygonal shape, more specifically, a quadrilateral shape. In exemplary embodiments, the polygonal shape or the quadrilateral shape may include a rounded polygon or quadrangle. More particularly, the first pixel 10 may have a rounded quadrangle shape.

The first pixels 10 may have substantially the same quadrilateral shape. The first pixels 10 may be spaced apart from one another and formed along a first virtual line VL1. The first pixel 10 may emit green light, and may include an organic emission layer for emitting the green light.

The second pixel 20 may be formed on a first vertex P1 of a virtual quadrangle VS, in which the center thereof may be the center of the first pixel 10. The third pixel 30 may be formed on a second vertex P2 of the virtual quadrangle VS. The virtual quadrangle VS may be a square.

The second pixel 20 may be spaced apart from the first pixel 10, and the center of the second pixel 20 may be positioned on the first vertex P1. The second pixel 20 may have a larger area than that of the adjacent first pixel 10. The second pixel 20 may have a polygonal shape, more specifically, a quadrilateral shape. The second pixels 20 may have substantially the same quadrilateral shape. The second pixels 20 may be spaced apart from one another having the first pixel 10 therebetween. The second pixel 20 may emit blue light, and may include an organic emission layer for emitting the blue light.

The third pixel 30 may be spaced apart from the first pixel 10 and the second pixel 20, and the center of the third pixel 30 may be positioned on the second vertex P2 adjacent to the first vertex P1. The third pixel 30 may have a larger area than that of the adjacent first pixel 10 and substantially the same area as that of the second pixel 20.

The third pixel 30 may have a polygonal shape, more specifically, a quadrilateral shape. The third pixels 30 may have substantially the same quadrilateral shape. The third pixels 30 may be spaced apart from one another having the first pixel 10 therebetween. The third pixel 30 may emit red light, and may include an organic emission layer for emitting the red light.

The third pixels 30 and the second pixels 20 may be alternately formed along a second virtual line VL2. Therefore, the second pixels 20 and the third pixels 30 may substantially surround the first pixel 10.

Furthermore, since the second pixels 20 and the third pixels 30 substantially surround the first pixel 10, an aperture ratio of each of the first to third pixels 10 to 30 may be improved. In this manner, the manufacturing cost and the manufacturing time of the touch display device may be reduced, and the quality of an image displayed on the touch display device may be improved.

According to an exemplary embodiment of a pixel arrangement, gaps between pixels of the same color are wide, such that the reliability of deposition during manufacture may be improved. In addition, gaps between pixel emitting different colors, which constitute sub-pixels, are narrow, such that the aperture ratio may be improved.

A touch screen layer is disposed on the display panel. The touch screen layer may be a touch screen panel, and may include a first touch electrode 1320 and a second touch electrode 1340.

The first touch electrode 1320 extends in a first direction D1. The first touch electrode 1320 may have a zigzag shape. The first touch electrode 1320 may be disposed in an area between the pixel areas. The first touch electrode 1320 may be spaced apart from the first pixel 10 by a first distance d1. In addition, the first touch electrode 1320 may be spaced apart from the third pixel 30 by a second distance d2. More particularly, a distance between the first touch electrode 1320 and the first pixel 10 (e.g., the first distance d1) may be different from a distance between the first touch electrode 1320 and the third pixel 30 (e.g., the second distance d2). In addition, a distance between the first touch electrode 1320 and the first pixel 10 (e.g., the first distance d1) may be different from a distance between the first touch electrode 1320 and the second pixel 20.

Each pixel of the display panel according to an exemplary embodiment has different aperture ratio. However, when touch electrodes are arranged to have an equal interval, and when viewing angle is increased, an overlapping extent ratio between each pixel and the touch electrodes may be varied. Accordingly, a change in luminance ratio for each pixel may be varied according to the viewing angle, which may generate defects in a display of the touch display device.

According to exemplary embodiments, however, the first touch electrode 1320 is disposed at a different distance with respect to each pixel. Thus, an overlapping extent ratio between each pixel and the touch electrodes may be adjusted, and thus, luminance decreasing ratio according to viewing angle may be adjusted. In this manner, defects in a display of the touch display device may be prevented.

The second touch electrode 1340 extends in a second direction D2 crossing the first direction D1. The second touch electrode 1340 may have a zigzag shape. The second touch electrode 1340 may be disposed in an area between the pixel areas. The touch electrode 1340 may include first branch portion 1341 and a second branch portion 1343 connected to the first branch portion 1341 and surrounds the first pixel 10. The second touch electrode 1340 may be spaced apart from the first pixel 10 by a third distance d3. In addition, the second touch electrode 1340 may be spaced apart from the third pixel 30 by a fourth distance d4. More particularly, a distance between the second touch electrode 1340 and the first pixel 10 (e.g., the third distance d3) may be different from a distance between the second touch electrode 1340 and the third pixel 30 (e.g., the fourth distance d4). In addition, a distance between the second touch electrode 1340 and the first pixel 10 (e.g., the third distance d3) may be different from a distance between the second touch electrode 1340 and the second pixel 20.

Each pixel of the display panel according to an exemplary embodiment has different aperture ratio. However, when touch electrodes are arranged to have an equal interval, and when viewing angle is increased, an overlapping extent ratio between each pixel and the touch electrodes may be varied. Accordingly, a change of luminance ratio for each pixel may be varied according to the viewing angle, which may generate defects in a display of the touch display device.

According to exemplary embodiments, however, the second touch electrode 1340 is disposed at a different distance with respect to each pixel. Thus, an overlapping extent ratio between each pixel and the touch electrodes may be adjusted, and thus, luminance decreasing ratio according to viewing angle may be adjusted. In this manner, defects in a display of the touch display device may be prevented.

According to an exemplary embodiment of a pixel arrangement, gaps between pixels of the same color are wide, such that the reliability of deposition during manufacture may be improved. In addition, gaps between pixel emitting different colors, which constitute sub-pixels, are narrow, such that the aperture ratio may be improved.

In addition, touch electrodes are disposed at a different distance with respect to each pixel. Thus, an overlapping extent ratio between each pixel and the touch electrodes may be adjusted, and thus, luminance decreasing ratio according to viewing angle may be adjusted. In this manner, defects in a display of the touch display device may be prevented.

Although certain exemplary embodiments and implementations have been described herein, other embodiments and modifications will be apparent from this description. Accordingly, the inventive concepts are not limited to such exemplary embodiments, but rather to the broader scope of the appended claims and various obvious modifications and equivalent arrangements.

What is claimed is:

1. A touch display device, comprising:
   a display panel; and
   a touch screen layer disposed on the display panel, the touch screen layer including a first touch electrode extending in a first direction and a second touch electrode extending in a second direction crossing the first direction, and the first and second touch electrodes each including a first connection portion and a second connection portion,
   wherein:
   the first and second connection portions of the first touch electrode are connected to another portion of the first touch electrode extending along the first direction;
   the first and second connection portions of the second touch electrode are connected to another portion of the second touch electrode extending along the second direction; and
   the first and second connection portions of the first touch electrode partially overlap the first and second connection portions of the second touch electrode.

2. The touch display device of claim 1, wherein the second touch electrode is disposed at a layer different from a layer of the first touch electrode.

3. The touch display device of claim 1, wherein the first and second connection portions of the first touch electrode parallel to the first and second connection portions of the second touch electrode.

4. The touch display device of claim 1, wherein an extending direction of the first and second connection portions of the first touch electrode forms an obtuse angle to the first direction.

5. The touch display device of claim 1, wherein an extending direction of the first and second connection portions of the second touch electrode forms an obtuse angle to the second direction.

6. A touch display device, comprising:
   a display panel including a first pixel and a second pixel having a size greater than a size of the first pixel; and
   a touch screen layer disposed on the display panel, the touch screen layer including a first touch electrode and a second touch electrode, and the first and second touch electrodes each including a first connection portion and a second connection portion,
   wherein:
   the first and second connection portions of the first touch electrode are connected to another portion of the first touch electrode extending along the first direction;
   the first and second connection portions of the second touch electrode are connected to another portion of the second touch electrode extending along the second direction; and
   a distance between the first pixel and the first touch electrode is less than a distance between the second pixel and the first touch electrode.

7. The touch display device of claim 6, wherein the first and second connection portions of the first touch electrode partially overlap the first and second connection portions of the second touch electrode.

8. The touch display device of claim 6, wherein the first and second connection portions of the first touch electrode are parallel to the first and second connection portions of the second touch electrode.

9. The touch display device of claim 6, wherein a distance between the first pixel and the second touch electrode is less than a distance between the second pixel and the second touch electrode.

10. The touch display device of claim 6, wherein
    the second pixel is adjacent to the first pixel in a first direction.

11. The touch display device of claim 10, wherein:
    the display panel further includes a third pixel having a size greater than the size of the first pixel; and
    a distance between the first pixel and the second touch electrode is less than a distance between the third pixel and the second touch electrode.

12. The touch display device of claim 11, wherein the distance between the first pixel and the first touch electrode is less than a distance between the third pixel and the first touch electrode.

13. The touch display device of claim 11, wherein
    the third pixel is adjacent to the first pixel in a second direction crossing the first direction.

14. The touch display device of claim 11, wherein the first, second, and third pixels emit green light, blue light, and red light, respectively.

15. The touch display device of claim 6, wherein the first and second pixels emit light of different colors.

* * * * *